United States Patent [19]

Polinsky

[11] 3,934,059
[45] Jan. 20, 1976

[54] METHOD OF VAPOR DEPOSITION
[75] Inventor: Murray Arthur Polinsky, Somerville, N.J.
[73] Assignee: RCA Corporation, New York, N.Y.
[22] Filed: Feb. 4, 1974
[21] Appl. No.: 439,581

[52] U.S. Cl. .................... 427/90; 427/91; 427/250; 427/404
[51] Int. Cl.² ........................................ C23C 13/02
[58] Field of Search .......... 117/107, 227, 217, 215, 117/71 M, 71 R, 106 R, 106 A, 201; 118/49.1, 49.5; 427/89, 124, 90, 250, 91, 404, 99, 405

[56] References Cited
UNITED STATES PATENTS

| 2,812,411 | 11/1957 | Moles | 117/107 |
| 3,184,329 | 5/1965 | Burns | 117/215 |
| 3,382,568 | 5/1968 | Kuiper | 29/578 |
| 3,498,818 | 3/1970 | Bahm et al. | 117/71 R |
| 3,518,506 | 6/1970 | Gates | 29/589 |
| 3,556,837 | 1/1971 | Hammond | 117/107 |
| 3,567,509 | 3/1971 | Kuiper | 117/217 |
| 3,594,214 | 7/1971 | Helwig et al. | 117/107 |
| 3,620,837 | 11/1971 | Leff et al. | 117/107 |

Primary Examiner—Cameron K. Weiffenbach
Assistant Examiner—Ralph E. Varndell, Jr.
Attorney, Agent, or Firm—H. Christoffersen; R. P. Williams

[57] ABSTRACT

A method of vapor depositing a material onto a substrate results in improved substrate step coverage by the material while keeping the substrate clean by minimizing the evaporation of contaminants onto the surface of the substrate. The method comprises depositing a first layer of material onto the substrate, while the substrate is at a first temperature, heating the substrate to a higher temperature, and then depositing a second layer while maintaining the substrate at the higher temperature.

6 Claims, 2 Drawing Figures

METHOD OF VAPOR DEPOSITION

BACKGROUND OF THE INVENTION

This invention relates to a method of vapor depositing a material onto a substrate.

In vapor depositing a material onto a substrate, it is often desired that the layer of deposited material be continuous without any cracks and also that the surface of the substrate remain relatively free of any impurities which might evaporate onto the surface during the vapor depositing process. Frequently, the surface of the substrate has one or more steps over which the material is to be vapor deposited. In order to effectively cover the substrate step with a continuous layer of material which is free of any cracks, the substrate is often heated to a higher temperature prior to vapor depositing the material.

In order to raise the temperature of the substrate, a heater must be used, such as a tungsten-filament radiant heater. Such a heater may be a source of impurities which can evaporate onto and contaminate the surface of the substrate. Such impurities are undesirable since they often diffuse into the substrate, in particular the insulating layers, and alter the electrical characteristics thereof.

DESCRIPTION OF THE PREFERRED EMBODIMENTS

Figure 1:
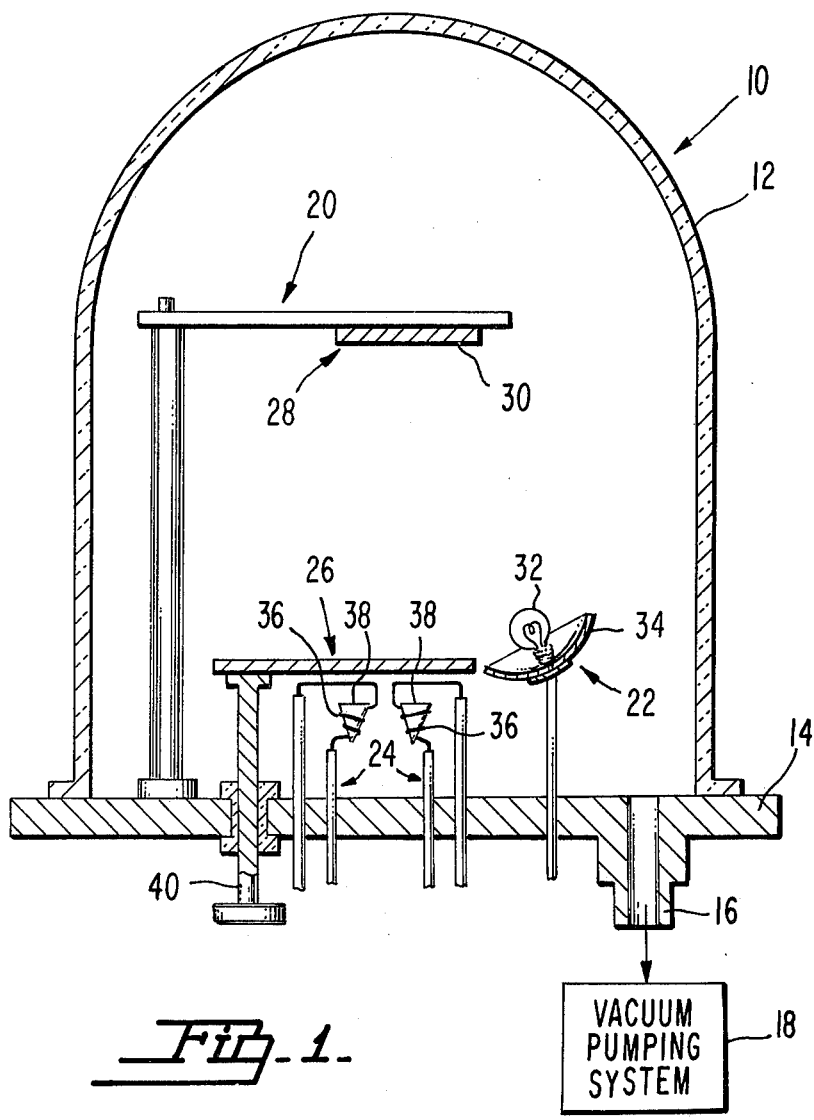
FIG. 1 is a diagrammatic cross-sectional view of an apparatus in which the method of the present invention can be carried out.

FIG. 1 illustrates a typical vacuum system which is particularly suitable for carrying out the vapor depositing method of the present invention. The vapor deposition is performed in an evaporation chamber 10 which includes a bell jar 12 mounted on a baseplate 14. The bell jar 12 is evacuated by means of a flanged opening 16 in the baseplate 14 which is connected to a vacuum pumping system 18.

The apparatus within the evaporation chamber 10 comprises a substrate holder 20, a substrate heater 22, a vapor source 24, and a shutter 26.

The substrate holder 20 holds a substrate 28 in a position which allows vaporized material to be deposited upon a surface 30 of the substrate 28. The holder 20 may have any design including that of a known complex planetary evaporation system, not shown, capable of simultaneously rotating and revolving a plurality of substrates 28 such as silicon wafers.

The substrate heater 22 may be any type capable of efficiently heating the substrate 28 without interfering with the vapor-depositing process. For example, a radiant substrate heater 22 may be used to heat a plurality of substrates 28 which are continually rotating and revolving on a planetary evaporation system. The radiant heater 22 is usually a tungsten-filament heating bulb 32 which is disposed in front of a metallic reflector 34 aimed at the surface 30 of the substrate 28.

The vapor source 24 may be any heating device which is capable of efficiently vaporizing the material to be deposited onto the substrate 28. One suitable known means, not shown, uses electron-beam bombardment. Electron-beam bombardment is an ideal way of vaporizing materials which are too nonvolatile to evaporate from a filament or crucible. An electron beam from a cathode electron gun heats the material to be deposited by striking the material directly without heating anything else. Another way of vaporizing the material is to use a hotfilament type of evaporator, illustrated in FIG. 1. Such an apparatus employs heating filaments 36, most commonly of tungsten, however, filaments of molybdenum, tantalum or niobium are quite satisfactory. Preferably, each tungsten filament 36 is bent into a double or triple-looped form which is then capable of holding one or more slugs 38 of the material to be vaporized.

The shutter 26 is attached to a rotary support 40 so that the shutter 26 may be selectively interposed between the vaporizing material 38 and the substrate 28 and removed from this position.

In carrying out the present method, the filament 36, the material 38 to be deposited, and the substrate 28 should be thoroughly cleaned by known conventional procedures. The substrate 28 is placed onto the substrate holder 20 in the evaporation chamber 10 immediately after being cleaned. The material 38 to be deposited is then positioned within the evaporation chamber 10. In the preferred embodiment of the present method, two metallic slugs 38 of, for example, aluminum are placed onto each of two double-looped tungsten filaments 36. Two filaments 36 are used in order to avoid the necessity of reheating the same filament during a later depositing step because the filament gets brittle after being once heated, and two slugs 38 on each filament 24 insure an adequate amount of metal 38 for the duration of the vapor depositing steps.

After insertion of the constituents, the evaporation chamber 10 is pumped down to a pressure of the order of $10^{-2}$ torr or lower, the maximum pressure permissible being determined in part by the dimensions of the evaporation chamber 10 or the distance from the vapor source 24 to the substrate 28, and by the purity of deposit desired. For a typical vapor source 24 to substrate 28 distance of 20 centimeters, it is preferable that the pressure within the evaporation chamber 10 be maintained at between $10^{-5}$ and $10^{-7}$ torr.

Figure 2:
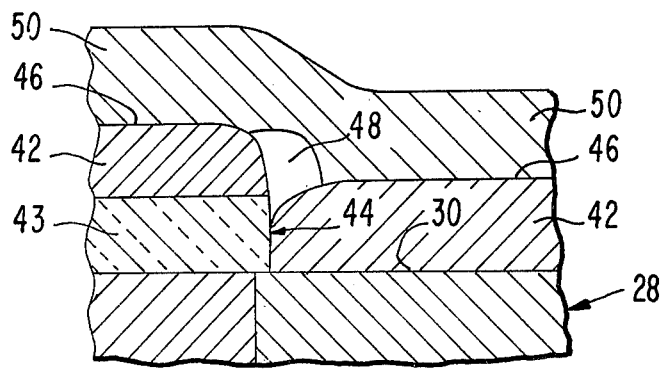
FIG. 2 is an example of an idealized cross-sectional view of a portion of a semiconductor wafer having an insulator step over which a material has been vapor deposited in accordance with the method of the present invention.

In the preferred embodiment of this method, a metal such as aluminum is vapor deposited upon a substrate 28 such as a silicon wafer 28 whose initial temperature is the ambient temperature of the room. The metallic slugs 38 on one of the filaments 36 are now melted down so that they wet the surface of the filament 36 and are vaporized by heating the filament 36 for approximately two minutes with the shutter 26 in the closed position to isolate the substrate 28 from the filament 36 and allow any volatile impurities to boil off onto the shutter 26. The shutter 26 is then opened for about three minutes and the vaporizing metal is deposited upon the substrate 28 at room temperature. The shutter 26 is then closed and the filament 26 is turned off. This step of the process yields a first layer 42 of metal which is approximately 7,000–8,000A in thickness when it is deposited in my apparatus under the conditions given above. FIG. 2 illustrates this first layer 42 by showing a portion of a typical semiconductor wafer 28 including the surface 30 thereof which has multiple levels. In the present example, the multiple-level surface 30 has two levels comprising a silicon dioxide layer 43 disposed on a portion of the wafer 28 to form a step 44, as shown in FIG. 2, over which material is vapor deposited in accordance with the method of the present invention. The first layer 42 is deposited, as described, without heating the substrate 28 and therefore before the substrate heater 22, by heating the substrate 28, can cause any impurities to evaporate onto and contaminate the surface 30 of the substrate 28. When the substrate 28 is not heated, the layer 42 deposits as a material which contains crystallites of relatively small size. Often these small crystallites do not join at the substrate step 44, leaving a discontinuity, generally indicated at 48. Under conditions where the step 44 is tapered and more gradual, a discontinuity such as a tunnel 48 may not form but thinning and cracking of the metal layer 42 at the step 44 frequently occurs. Where the step 44 is even more gradually tapered, this first layer 42 alone may provide smooth uniform coverage, but the method of the present invention will insure effective step coverage.

The substrate heater 22 is then turned on and the substrate 28 is heated to and maintained at a higher temperature. This temperature should be high enough to achieve in a subsequent evaporation operation, effective coverage of a substrate 28, having one or more steps, with a continuous layer of metal which is free of any cracks or discontinuities at the steps. For depositing aluminum upon a silicon wafer 28, maintaining the temperature of the silicon wafer 28 at about 300°C provides good step coverage. The first layer 42 acts as an effective shield against any impurities which might subsequently evaporate onto the surface, 46, of the first layer 42 during this heating of the substrate 28 and prevents any such impurities from diffusing into the substrate 28 and altering its electrical characteristics. Although the surface 30 of the substrate 28 at the discontinuity 48 may still be unprotected during this heating step, the area of the substrate 28 which may be exposed is very small. Some contamination may enter the substrate 28 at this location, but the amount should be relatively insignificant.

With the shutter 26 closed, the metallic slugs 38 on the other of the two filaments 36 are then melted down and vaporized by heating the filament 36 for approximately one and one-half minutes. The shutter 26 is then opened for about three and one-half minutes while a second layer 50 (FIG. 2) of metal is vapor deposited upon the first layer 42 of metal, and then the shutter 26 is closed and the filament 24 is turned off. As the vaporized material impinges upon the heated substrate 28 during this second deposition, larger crystallites are formed due to the heat from the substrate 28, and these larger crystallites can effectively bridge the discontinuity 48 left by the first layer 42. The thickness of this second layer 50 is approximately 10,000A, which gives a metallic coating on the substrate 28 having a total thickness between 17,000 and 18,000 A. The substrate heater 22 is then turned off, and preferable after the substrate 28 has cooled to about 150°C the evaporation chamber 10 is vented to the atmosphere.

Instead of exposing the substrate 28 to the vaporizing material for a measured period of time, the desired thickness of the coating may be achieved by measuring the mass of material deposited during vapor deposition through the use of a quartz crystal microbalance. In this known method, the resonant frequency of a synthetic quartz crystal plate is changed by the mass of the material deposited on one face, and by monitoring the changing frequency one can determine film thickness from the available knowledge of film density.

This method of vapor depositing a material 38 onto a substrate 28 will result in improved substrate step coverage by the material 38 while keeping the substrate 28 clean by minimizing the evaporation of contaminants onto the surface 30 of the substrate 28. Photographs of a coating made by this method obtained with a scanning electron microscope show good step coverage, and capacitance-voltage (c-v) plots under bias temperature stress show good substrate cleanliness.

What is claimed is:

1. A method of vapor depositing a metallic material onto a substrate within an evacuated evaporation chamber comprising the steps of:
   depositing a first layer of said metallic material onto said substrate while maintaining said substrate at a first temperature,
   heating said substrate to a second temperature, and
   depositing a second layer of said same metallic material onto said first layer while maintaining said substrate at said second temperature.

2. A method as recited in claim 1 wherein said substrate includes a surface having multiple levels over which said metallic material is deposited.

3. A method as recited in claim 1 wherein said first temperature is the ambient temperature of the room.

4. A method as recited in claim 1 wherein said metallic material comprises metallic slugs and wherein said method further comprises:
   placing metallic slugs of the same metallic material onto first and second looped tungsten filaments repsectively located within said evaporation chamber,
   heating said first filament behind a closed shutter whereby the metallic slugs therein are melted to a vaporizing state,
   opening said shutter whereby said substrate is exposed to said vaporizing metal for a period of time,
   closing said shutter and turning off heat to said first filament,
   after heating said substrate to said second temperature, heating said second filament behind said closed shutter whereby the metallic slugs therein are melted to a vaporizing state,
   opening said shutter whereby said substrate is exposed to said vaporizing metal for a period of time, and
   closing said shutter and turning off heat to said second filament.

5. A method as recited in claim 4 wherein said substrate is a semiconductor wafer covered partially by a layer of silicon dioxide, said metallic slugs are aluminum, said first temperature is the ambient temperature of the room, and said second temperature is about 300°C.

6. A method as recited in claim 1 wherein the thickness of said first layer is about 8,000A and the thickness of said second layer is about 10,000A.

* * * * *